(12) United States Patent
Pradel

(10) Patent No.: US 6,292,368 B1
(45) Date of Patent: Sep. 18, 2001

(54) ELECTRICAL POWER COMPONENT MOUNTED BY BRAZING ON A SUPPORT AND CORRESPONDING MOUNTING PROCESS

(75) Inventor: Denis Pradel, Pierrelaye (FR)

(73) Assignee: Sagem SA, Paris (FR)

( * ) Notice: Subject to any disclaimer, the term of this patent is extended or adjusted under 35 U.S.C. 154(b) by 0 days.

(21) Appl. No.: 09/521,231

(22) Filed: Mar. 8, 2000

(30) Foreign Application Priority Data

Mar. 9, 1999 (FR) .................................................. 99 02878

(51) Int. Cl.⁷ .................................................... H01L 23/02
(52) U.S. Cl. ........................ 361/719; 361/704; 361/717; 361/767; 257/701; 257/703; 165/80.3
(58) Field of Search ..................................... 361/702–707, 361/715–719, 709–713, 721–723, 767, 759; 257/700–727, 697–698, 773–774, 692, 758, 736, 779, 107; 29/832, 841, 843, 880, 760, 740, 850; 174/52 FP, 16.3; 165/80.2–80.4, 165, 185

(56) References Cited

U.S. PATENT DOCUMENTS

| | | | |
|---|---|---|---|
| 3,142,783 | * 7/1964 | Warren | 317/101 |
| 3,192,307 | * 6/1965 | Lazar | 174/68.5 |
| 3,290,756 | * 12/1966 | Dreyer | 29/155.5 |
| 4,047,197 | * 9/1977 | Schierz | 357/81 |
| 4,626,478 | * 12/1986 | Soerewyn | 428/596 |
| 4,646,129 | * 2/1987 | Yerman et al. | 357/74 |
| 4,979,076 | * 12/1990 | DiBugnara | 361/401 |
| 5,394,303 | 2/1995 | Yamaji | 361/749 |
| 5,446,316 | * 8/1995 | Temple et al. | 257/704 |
| 5,544,412 | * 8/1996 | Romero et al. | 29/832 |
| 5,703,405 | 12/1997 | Zeber | 257/777 |
| 5,895,974 | * 4/1999 | Eytcheson et al. | 257/723 |
| 6,057,612 | * 5/2000 | Temple | 307/150 |
| 6,072,240 | * 6/2000 | Kimura et al. | 257/735 |

FOREIGN PATENT DOCUMENTS 0 198 376 A1  10/1986 (FR).
WO 90 13991  11/1990 (WO).

* cited by examiner

Primary Examiner—Leo P. Picard
Assistant Examiner—Michael Datskovsky
(74) Attorney, Agent, or Firm—Quarles & Brady LLP

(57) ABSTRACT

An electrical power component is provided with electrodes including, on one of the faces of the component, a single electrode, the electrodes being connectable by brazing to an electrical connection support by means of an electrical and thermal connection plate.

4 Claims, 1 Drawing Sheet

Figure 1:
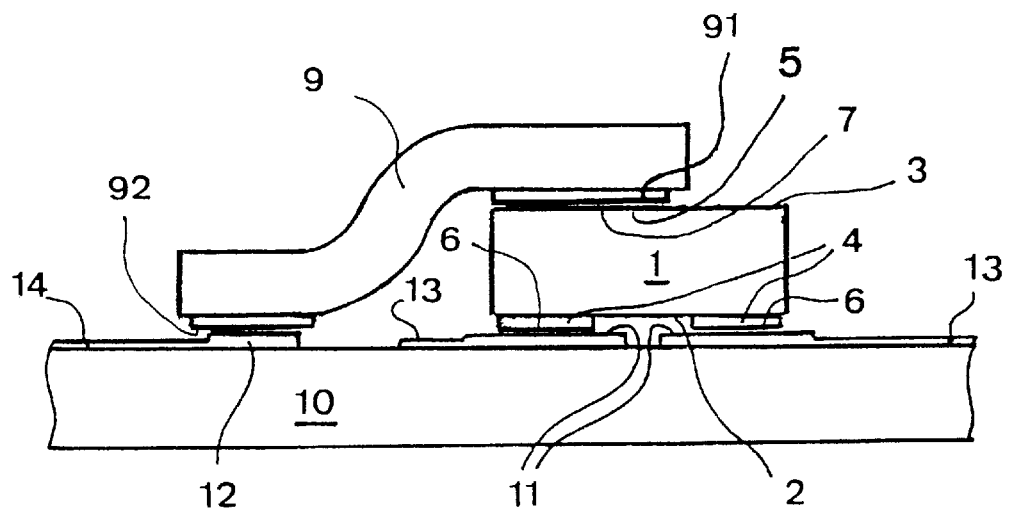

ELECTRICAL POWER COMPONENT MOUNTED BY BRAZING ON A SUPPORT AND CORRESPONDING MOUNTING PROCESS

The present invention relates to electrical power components, such as transistors, which are mounted on a printed circuit board or the like. They are used, for example, in the field of automobiles for engine control or even to produce power converters.

The mounting, on a given printed circuit, of a power component and other electrical components which must be connected thereto aims to facilitate the task of establishing appropriate connections.

This task, however, necessitates several operations because a power component has two active faces, one with a single electrode such as a transistor collector or diode electrode and the other face comprising the other diode electrode or the other electrodes of the transistor.

When connecting the electrodes of these two faces electrically to the other components, the tracks of the printed circuit permit direct connection of only the electrode or electrodes of one of the faces, which is placed against the printed circuit. Furthermore, since a power component is involved, high currents pass through it and this necessitates connections with a large cross section. Furthermore, it is necessary to be able to dissipate the heat produced by his power component The present invention aims to facilitate the mounting of such an electrical power component on an electrical connection support To this end, the invention firstly relates to an electrical power component provided with electrodes including, on one of the faces of the component, a single electrode, the electrodes being arranged to be connected by brazing to an electrical connection support, the said single electrode being arranged to be connected to the support by means of an electrical and thermal connection plate.

Thus by a single brazing operation it is possible to connect the electrodes of the two faces of the component to the support electrically, while at the same time ensuring mechanical attachment of the component to this support as well as low electrical and thermal resistances with respect thereto by reason of the fact that a plate has a cross-section considerably larger than a simple wire.

Components are indeed known, but of low power, having a single active face, to be brazed onto a printed circuit in order to attach them thereto by an inactive face on the underside, opposite the active face on the upper side, and in order then to connect the electrodes of the active face electrically to the printed circuit by wires which are brazed one by one.

Another known solution for connecting such low-power components to the printed circuit consists of producing brazing protuberances on the electrodes of the active face and placing this active face on the circuit in order thus to connect it thereto mechanically and electrically.

These two previous arts, with a single active face, did not permit the solution of the invention to be achieved.

The invention also relates to a board of electrical components including a power component of the invention, with receiving areas connected by brazing to the electrodes of the power component, to the said single electrode by means of an electrical and thermal connection plate.

Finally, the invention relates to a process for mounting, on an electrical connection support, an electrical power component provided with electrodes including, on one of the faces of the component, a single electrode, the process being characterised in that the component is placed on the support and the electrodes are placed facing brazing areas of the support connected to conductive tracks, at least one plate is placed on the face with the single electrode of the component, with a layer of brazing product being interposed, and the board is passed into a brazing furnace in order to connect all its electrodes collectively to the receiving areas and to change the plate into an electrical and thermal connection plate.

The establishment of all the connections is thus carried out in an overall manner in a single step.

Figure 2:
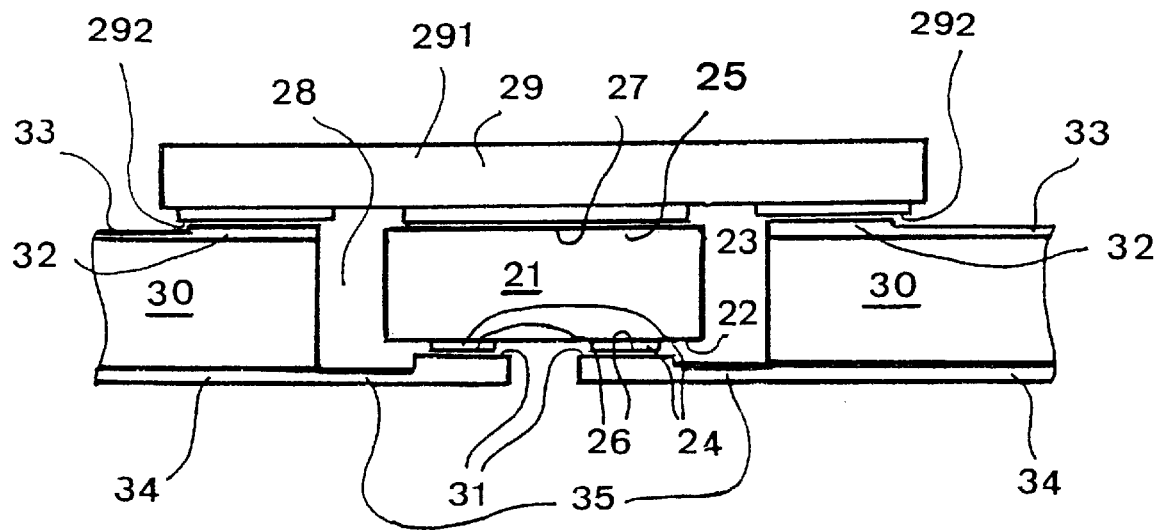

The invention will be better understood with the aid of the following description of two preferred embodiments of the electrical power component of the invention and of a preferred method of mounting thereof on a board, with reference to the attached drawing in which:

FIG. 1 is a lateral cross-sectional view representing the component mounted on a printed circuit board, and FIG. 2 is another lateral cross-sectional view of the component mounted in a printed circuit window.

In FIG. 1, the illustrated electrical power component is a chip 1 of semi-conductor material attached to a printed circuit board 10 of which a single face has tracks 13, 14 of tinned copper, 400 $\mu$m thick in this example. The tracks 13, 14 permit electrical connection of the electrodes, defined hereinunder, of the chip 1 to other electrical circuits carried by the board 10.

The chip 1, which is in the form of a substantially parallelepiped rectangle, comprises two active faces 2, 3, which are in this case opposite and horizontal and perpendicular to the plane of FIG. 1. The face 3, the upper face in FIG. 1, comprises a single electrode 5 which corresponds, for example, to the drain or to the collector in the case of a transistor, or to one of the two electrodes of a diode. The function of the power chip 1 is not, however, limited to these types of functions. The lower face 2 comprises another or other electrodes, in this case two electrodes generally referenced 4, such as the transistor emitter and base, which are necessary to the operation of the chip 1 in relation to other components.

All these electrodes 4, 5 have been produced by depositing a metallization layer during manufacture of semi-conductor wafers comprising chips, not yet cut out, such as that referenced 1. Each electrode 4, 5 has, on its surface, in this example, a layer of a product permitting brazing, forming a contact area for external connection 6 or 7 respectively. The electrodes 4 comprise protuberances covered with the brazing product, as spacers between the mounting face 2 of the component 1 and the support board 10 for electrical connection.

The tracks 13 of the printed circuit 10 each lead to an area 11 for receiving an area 6 of the component, and bearing a product for brazing, the brazing areas 11 of the supporting printed circuit 10 as a whole forming a pattern corresponding to the arrangement of the areas 6 in order to receive them.

Furthermore, the printed circuit 10 has a receiving area 12, also for brazing, with a large surface, in an electrical and/or thermal sense, connected to the track 14, on which can be brazed a brazing contact area zone 92 in this case at one end of a plate 9 for electrical and thermal connection, of which another brazing contact area zone 91, in this case at the opposite end, can be brazed on the area 7 of the single electrode 5 of the upper connection face 3. The two contact areas 91, 92 extend in two horizontal planes in FIG. 1, thus parallel to the plane of the board 10 and to the faces 2 and 3. The plate 9 constitutes a bar with areas 91, 92 with a large surface, which is horizontal in FIG. 1, to establish contacts by brazing to the area 7 and the receiving area 12.

The plate 9, being copper-based, for example, provides a connection with low electrical and thermal resistances between the chip 1 and the printed circuit 10. The calories dissipated by the chip 1 can thus be evacuated to the outside of this chip towards any thermal well, the plate 9 itself radiating a part of the thermal energy which it receives and thus constituting a radiator. The plate 9 can be a single plate as shown or it can be divided into a plurality of such plates, electrically and thermally in parallel, in order, for example, to overcome problems of play and tolerance.

In order to mount, on the board 10, the chip 1 provided with electrodes 4, 5, including the single electrode 5 on the connection face 3 of the chip 1 and at least one electrode such as that referenced 4, in this case several, on the mounting face 2 of the chip 1, the chip 1 is placed on the board 10 and the electrode 4 of the mounting face 2 is placed facing the brazing area 11 of the board 10 connected to the conductive track 13, the plate 9 or a plurality of such plates is placed on the connection face 3 with the single electrode 5 of the chip 1 and on the other brazing area 12 of the board 10 connected to the conductive track 14 with a layer of brazing product being interposed, and the board 10 is passed into a brazing furnace in order to connect all its electrodes 4, 5 to the receiving areas 11, 12 collectively and to convert the plate 9 into an electrical and thermal connection plate.

The embodiment of FIG. 2 corresponds schematically to that of FIG. 1, in which the plate 9 has been flattened to the level of the printed circuit 10 and thus the chip 1 and the receiving areas 11 which would then be at the level of the lower face of the circuit 10 have been moved downwards by this extent through the printed circuit 10.

In the embodiment of FIG. 2, the chip, then referenced 21, is this time housed in the thickness of the double-sided printed circuit board 30. In this example, the chip 21 is of substantially the same thickness as the printed circuit board 30 so that its housing 28, which in this case is milled into the epoxy glass separating the two faces, opens into the two opposite faces of the printed circuit 30. The upper face of the latter has tracks 33 connected to receiving areas 32 to be brazed and its lower face has a pattern of receiving areas 31 to be brazed, each connected to a particular track 34 and each carried by a conductive tab 35 forming an extension of a track 34. It will be noted that the housing 28 could be provided in a different manner, for example, by stamping the insulator before depositing the conductive layers.

The chip 21 has the same structure as the chip 1, with a lower face 22 with electrodes 24 with contact areas 26 for brazing and an upper face 23 having a single electrode 25 with a contact area 27 to be brazed. The process of mounting on its support board 30 is the same as that indicated for the chip 1. A support board could, in particular, carry one or several components 1 according to the mounting arrangement indicated in FIG. 1 and one or several components 21 mounted in accordance with FIG. 2 in order to connect them to each other.

The plate 9 is in this case replaced by an entirely planar plate 29 placed against the printed circuit 30 above the housing 28 and protruding beyond it laterally in order to be connected by brazing of area(s) 292 to one of the receiving areas 32, the counterpart of the receiving area 12, and preferably, as in this case, to a receiving area 32 located at the periphery of the housing 28. In this way mechanical rigidity is improved and electrical and thermal connection resistances between the chip 21 and the board 30 are reduced. It is the plate 29 which ensures that the chip 21 is firmly attached to the board 30.

As shown, the receiving areas 31 are disposed on respective tabs 35 overhanging on the layer of epoxy glass or other substance forming the insulating core of the board 30, ie. the tabs 35 project from the wall of the housing 28. In this way they constitute flexible bars or fingers which absorb the possible mechanical stresses caused by different thermal dilations between the chip 21 and the board 30, in particular during brazing and subsequent thermal cycles.

In one variation, the plate 29 could be replaced by a printed conductive layer on the upper face of the printed circuit 30, thus forming the base of the housing 28, of a thickness sufficient to ensure the mechanical strength and electrical connection of the chip 21. In such a case, the chip 21 would be introduced into its housing by moving apart the flexible tabs 35 which partially obstruct its access.

The manufacture of the chips 1, 21 is carried out in a standard manner from thin wafers of semi conductor material, on which the various constituent layers of the electrical components used have been built up in order to form a mosaic of elementary zones which, after cutting of the plate, form the chips.

In this case, since each zone comprises a face 3, 23 with a single electrode and an opposite face 2, 22 with at least one electrode, on each face of the wafer a layer of a product for adhesion to the plate is deposited and then thereon a layer of a brazing product permitting brazing of the two faces, 3, 23; 2, 22 of each chip 1, 21 is deposited. If required, a layer of a product for adaptation of the adhesion product and of the brazing product is deposited on the adhesion product layer before depositing the layer of brazing product.

The adhesion layer, on the semi-conductor, such as silicon, can also serve as a stop layer to protect the silicon from any penetration of atoms from the layer deposited on the stop layer. The stop layer is, for example, made of titanium/tungsten. The adaptation layer is, for example, copper. This layer is the thickest of the deposited layers so as to produce a protuberance and thus ensure contact with the receiving areas such as 11 of the printed circuit, the corresponding surface 2 of the chip 1 thus remaining slightly distanced from the surface of the printed circuit 10 and protected by a passivation layer. The external layer of brazing product is formed, for example, by a deposit of a tin/lead alloy which ensures the desired brazability. The receiving areas 11, 12, 31, 32 of the printed circuit are also covered with a similar product.

As a variation, and depending on the selection of the assembly machines used, the brazing paste can be deposited on one or other of the facing surfaces to be brazed.

What is claimed is:

1. A board of electrical components comprising:

a receiving area on each of a first and a second face of the board;

an electrical power component provided with electrodes including, a single electrode on one of the face of the component, a single electrode, the electrodes being connected by brazing to the receiving areas of the board, the said single electrode being connected to the receiving area on the first face of the board by means of an entirely planar electrical and thermal connection plate received by the receiving area on the first face of the board; and a housing for the power component;

wherein the power component is of substantially the same thickness as the board and the housing is limited by the connection plate, a plurality of flexible tabs provided with the receiving areas, and extending conductive tracks of the board.

2. The board according to claim 1, wherein the electrodes of the electrical power component comprise spacers between the surface of the component and the board.

3. The board according to claim 1, wherein the plate is a single plate.

4. The board according to claim 1, wherein the receiving areas are located on the same face of the board and the electrical and thermal connection plate has two zones brazed respectively to one of the receiving areas and to the single electrode.

* * * * *